US009000463B2

(12) United States Patent
Huang

(10) Patent No.: US 9,000,463 B2
(45) Date of Patent: Apr. 7, 2015

(54) LED HOUSING WITH FLUOROPOLYMER SURFACE COATING LAYER AND LED STRUCTURE HAVING THE SAME

(76) Inventor: Pang-Ming Huang, Luzhu Township (TW)

( * ) Notice: Subject to any disclaimer, the term of this patent is extended or adjusted under 35 U.S.C. 154(b) by 714 days.

(21) Appl. No.: 13/086,739

(22) Filed: Apr. 14, 2011

(65) Prior Publication Data

US 2011/0254038 A1 Oct. 20, 2011

(30) Foreign Application Priority Data

Apr. 14, 2010 (TW) ............................... 99111570 A

(51) Int. Cl.

*H01L 33/48* (2010.01)
*H01L 33/60* (2010.01)
*H01L 33/50* (2010.01)
*H01L 33/62* (2010.01)

(52) U.S. Cl.

CPC ............... *H01L 33/60* (2013.01); *H01L 33/507* (2013.01); *H01L 33/62* (2013.01); *H01L 2224/48091* (2013.01); *H01L 2224/48247* (2013.01)

(58) Field of Classification Search

CPC ....................................................... H01L 33/48
USPC ............................................ 257/98, E33.058
See application file for complete search history.

(56) References Cited

U.S. PATENT DOCUMENTS

2007/0269586 A1* 11/2007 Leatherdale et al. ........... 427/66
2008/0054287 A1* 3/2008 Oshio et al. ..................... 257/99
2010/0032702 A1 2/2010 Lahijani
2010/0079058 A1* 4/2010 Schmidt et al. ............... 313/503
2011/0248293 A1* 10/2011 Chan et al. ...................... 257/89
2011/0278601 A1* 11/2011 Hsieh et al. ..................... 257/88

FOREIGN PATENT DOCUMENTS

JP 2005-019488 A 1/2005
JP 2007-242820 A 9/2007
JP 2010-177443 A 8/2010
WO 2009026284 A3 2/2009
WO 2010035788 A1 4/2010

OTHER PUBLICATIONS

Office Action mailed May 14, 2013 in counterpart Japanese Application No. 2011-088955.
Office Action mailed Oct. 2, 2012 in counterpart Japanese Application No. 2011-088955.

* cited by examiner

*Primary Examiner* — Marc Armand
(74) *Attorney, Agent, or Firm* — Snell & Wilmer L.L.P.

(57) ABSTRACT

A housing for supporting a light-emitting diode chip is disclosed. The housing includes a housing body made of non-fluoro-containing polymer and a surface coating layer covering at least a portion of the housing body. The surface coating layer is made of fluoropolymer dispersion and provided for reflecting light emitted from a light-emitting diode chip disposed on the housing body. A structure of light-emitting diode including the housing and a light-emitting diode chip is also disclosed.

16 Claims, 3 Drawing Sheets

LED HOUSING WITH FLUOROPOLYMER SURFACE COATING LAYER AND LED STRUCTURE HAVING THE SAME

RELATED APPLICATIONS

This application claims the right of priority based on Taiwan Patent Application No. 99111570, entitled "LED HOUSING WITH FLUOROPOLYMER SURFACE COATING LAYER AND LED STRUCTURE HAVING THE SAME," filed on Apr. 14, 2010. The entire content of the aforementioned application is incorporated herein by reference.

FIELD OF THE INVENTION

The present invention relates to an LED (light-emitting diode) structure, and more particularly, to an LED housing with fluoropolymer surface coating layer and an LED structure having the same.

BACKGROUND OF THE INVENTION

How to improve the light extraction efficiency is always an important issue in the development of light-emitting diode. One reason that the light extraction efficiency is difficult to improve is that internal reflections or refractions from the light-emitting diode chip itself and interfaces between the light-emitting diode chip and peripheral devices cause the light emitted from the light-emitting diode chip to be absorbed by the peripheral devices. In order to solve this problem, the light-emitting diode is typically covered with a titanium dioxide-containing housing. Titanium dioxide can improve the reflectivity to visible light. Such a housing is typically made of polyphenylhydrazine (PPA) engineering plastics. However, the drawback of such an approach is that the use of titanium dioxide will cause the PPA housing to gradually become yellowish, and hence the light extraction efficiency is reduced.

Another conventional approach is disclosed in US 2010/0032702, which uses fluoro-containing engineering plastics instead of PPA. In such an approach, the housing is made of fluoropolymer by injection molding to solve the yellowish problem. However, since the fluoropolymer is much more expensive, the manufacturing cost for the housing significantly increases, resulting in difficulties to practice on various light-emitting diode devices.

SUMMARY OF THE INVENTION

Accordingly, the present invention has been made keeping in mind the above problems occurring in the prior art, and one aspect of the present invention is to provide a new and inventive LED structure including a housing with fluoropolymer surface coating layer. The fluoropolymer coating layer covers the housing body made of non-fluoro-containing polymer engineering plastics. In the embodiment, the fluoropolymer surface coating layer is formed by coating fluoropolymer dispersion on the housing body. Consequently, the amount of fluoropolymer used in the housing is significantly less than that used in the conventional injection molded housing. Moreover, in the embodiment, currently market-available housings made of non-fluoro-containing polymer can still be used, providing advantages of increasing the usability and conserving resources.

In one embodiment, the fluoropolymer surface coating layer has a stable color, is capable of reflecting visible light, and can be subjected to the welding process at a temperature from 260° C. to 280° C. for more than 3 minutes.

In one embodiment, the housing body can be made of PPA engineering plastics. In another embodiment, the housing body can be made of liquid crystal polymer engineering plastics.

In one embodiment, the housing body further includes a recess for positioning the light-emitting diode chip and the surface coating layer covers only the surface of the recess.

In one embodiment, the fluoropolymer dispersion includes fluoropolymer. The fluoropolymer includes homopolymer of vinyl fluoride, copolymer of perfluoroalkoxy fluorocarbon resin, or homopolymer of vinylidene fluoride.

In one embodiment, the fluoropolymer dispersion includes a filling material capable of diverging visible light.

In one embodiment, the fluoropolymer dispersion includes a filling material capable of adjusting modulus of the surface coating layer.

In one embodiment, the fluoropolymer dispersion includes a luminescent compound.

Other aspects of the present invention solve other problems and are disclosed and illustrated in detail with the embodiments below together with the aforesaid aspects.

DETAILED DESCRIPTION OF THE INVENTION

Figure 1A:
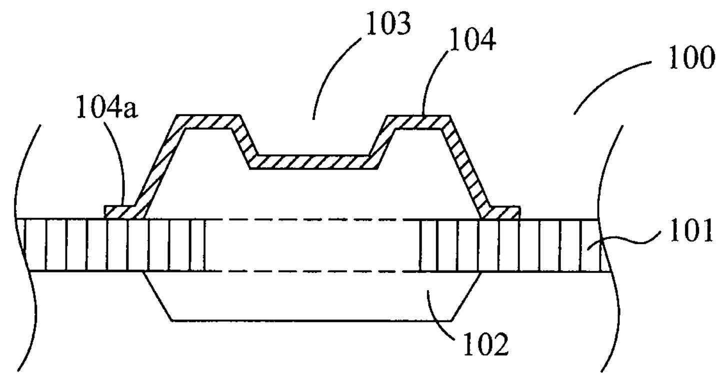
FIG. 1A through FIG. 1D are cross-sectional views of various housings with recess in accordance with embodiments of the present invention.

The preferred embodiments of the present invention will now be described in greater details by referring to the drawings that accompany the present application. The similar elements in the accompanying drawings employ the same numeral references. It should be noted that the features illustrated in the drawings are not necessarily drawn to scale. Descriptions of well-known components, materials, and process techniques are omitted so as to not unnecessarily obscure the embodiments of the invention.

In accordance with one embodiment of the present invention, the housing for supporting a light-emitting diode chip can have multiple functions. The housing can serve as supporter for the light-emitting diode chip, so that the LED package is provided with appropriate position and orientation to be electrically connected to a circuit board. The package can contain phosphors. For example, blue LED chip is adopted with green phosphors and red phosphors to produce white light. Moreover, the housing for supporting the light-emitting diode chip can also reflect light to increase the total brightness of the LED device.

FIG. 1A through FIG. 1D illustrate various housings with recess in accordance with embodiments of the present invention. As shown in FIG. 1A, a housing 100 for supporting a light-emitting diode chip includes a metal frame 101 and a housing body 102 connected to the metal frame 101. The metal frame 101 is selectively penetrates through the housing body 102, as indicated by the dotted line. The metal frame 101 can be made of electrically conductive metal. The housing body 102 is made of non-fluoro-containing polymer, such as PPA, liquid crystal polymer, or other suitable engineering plastics by injection molding. The housing body 102 is formed with a recess 103, which is the location for positioning the light-emitting diode chip. One recess 103 can receive one or more LED chips. The recess 103 can have a shape suitable for reflecting light at desired angle, and hence its depth, inclined angle of the sidewall, dimension, etc. can be determined by the designer as appropriate.

Figure 1B:
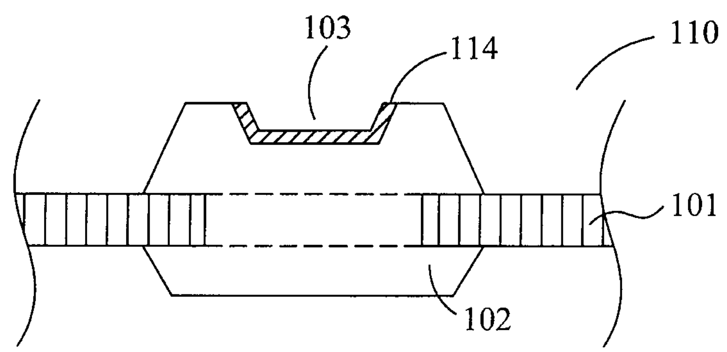
Figure 1C:
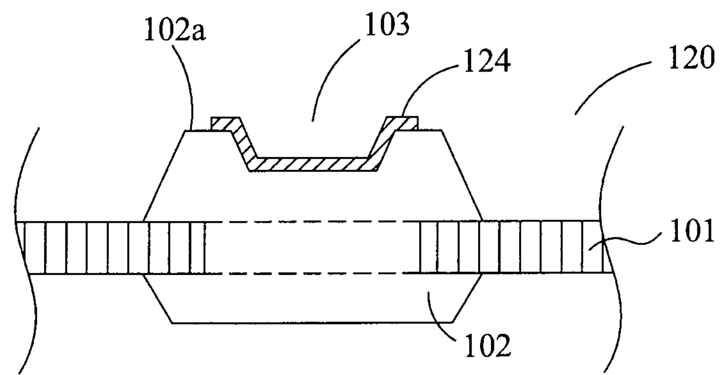
Figure 1D:
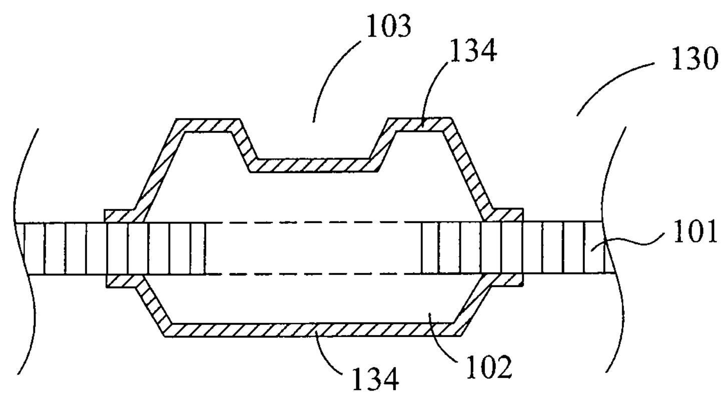

Also referring to FIG. 1A, the housing 100 further includes a surface coating layer 104 covering at least a portion of the housing body 102. The surface coating layer 104 is made of fluoropolymer dispersion and is provided for reflecting light emitted from a light emitting diode chip disposed on the housing body 102. The surface coating layer 104 of FIG. 1A covers the housing body 102 that is above the surface of the metal frame 101. The surface coating layer 104 further includes an extension part 104*a* covering one side of the metal frame 101. FIG. 1B illustrates a housing 110 in accordance with another embodiment of the present invention. The housing 110 of FIG. 1B is different from the housing 100 of FIG. 1A in that the surface coating layer 114 only covers the surface of the recess 103. FIG. 1C illustrates a housing 120 in accordance with a further embodiment of the present invention. The housing 120 of FIG. 1C is different from the housing 110 of FIG. 1B in that the surface coating layer 124 covers a portion of the top surface 102*a* of the housing body 102 in addition to the surface of the recess 103, wherein a portion of the housing body 102 above the metal frame 101 is exposed and not covered by the surface coating layer 124. FIG. 1D illustrates a housing 130 in accordance with yet another embodiment of the present invention. The housing 130 of FIG. 1D is different from the housing 100 of FIG. 1A in that the surface coating layer 134 covers the entire surface of the housing body 102.

Figure 2:
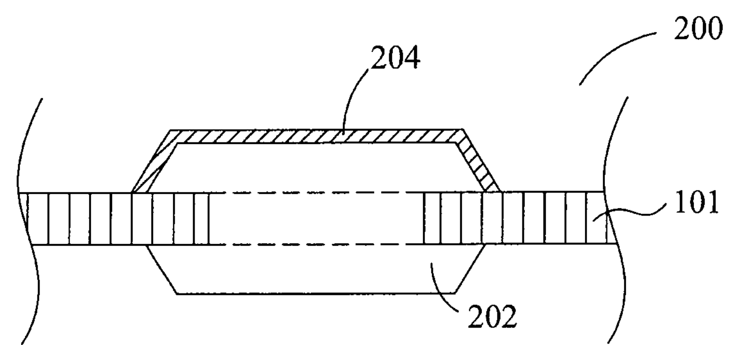
FIG. 2 is a cross-sectional view of the housing without recess in accordance with one embodiment of the present invention.

FIG. 1A through FIG. 1D exemplarily illustrate variations of the surface coating layer in various embodiments of the present invention, wherein each surface coating layer is associated with an individual manufacture process. After the formation of the metal frame and the housing body is completed, by using suitable coating techniques, such as sputtering, spray coating, or dipping, in cooperation with suitable mask, or by post-coating etching to remove undesired coating layer, the surface coating layer in various desired pattern can be formed. FIG. 2 illustrates a planar housing 200 (i.e. a housing without the recess 103) including a metal frame 101, a housing body 202, and a surface coating layer 204 covering the entire surface of the housing body 202 which is above the metal frame 101. The present invention is not limited to the above embodiments. It will be understood by those skilled in the art that the surface coating layer of the present invention includes those embodiments capable of reflecting light emitted from the light-emitting diode chip disposed on the housing body.

As described above, the surface coating layer is made of fluoropolymer dispersion. In one embodiment of the present invention, the fluoropolymer surface coating layer has a stable color, is capable of reflecting visible light, and can be subjected to the welding process at a temperature from 260° C. to 280° C. for more than 3 minutes. In one embodiment, the fluoropolymer surface coating layer has a photopic reflectance of at least 80% for wavelength from 380 nm to 780 nm.

The fluoropolymer dispersion includes fluoropolymer and other suitable filling materials, wherein the content of the fluoropolymer is about 30 wt % to 90 wt % of the total weight of the fluoropolymer dispersion, and the content of the filling material is about 10 wt % to 70 wt % of the total weight of the fluoropolymer dispersion. The fluoropolymer dispersion has the characteristic of being deposited on the housing body by coating process, wherein the coating process can be spray coating, dipping, or other suitable techniques.

The fluoropolymer in the fluoropolymer dispersion includes polymer of various molecular weights, wherein the monomer can have carbon number from 2 to 8. The fluoropolymer can be homopolymer composed of single monomer, copolymer composed of multiple monomers, or a combination thereof. The monomer can contain or not contain fluorine. For example, the monomer without fluorine can be ethylene, propylene; the monomer with fluorine can include, but not limited to, tetrafluoroethylene (TFE), vinyl floride (VF), vinylidene fluoride (VDF), hexafluoroisobutylene (HFIB), hexafluoropropylene (HFP), or perfluoro (alkyl vinyl ether) (PAVE). The perfluoro of PAVE contains 1 to 5 carbon atoms, which can be a linear or branch structure, such as perfluoro (methyl vinyl ether) (PMVE), perfluoro (ethyl vinyl ether) (PEVE), perfluoro (propyl vinyl ether) (PPVE), or perfluoro (butyl vinyl ether) (PBVE). The fluoropolymer illustrated in various embodiments can be selected from the following, but not limited to: copolymer of TFE and HFP referred to perfluorinated ethylene-propylene (FEP), copolymer of TFE and PAVE referred to perfluoroalkoxy fluorocarbon resin (PFA), homopolymer of VDF referred to PVDF, copolymer of ethylene and TFE referred to ethylene tetrafluoroethylene (ETFE), homopolymer of VF referred to PVF, homopolymer of chlorotrifluoroethylene referred to PCTFE, copolymer of ethylene and chlorotrifluoroethylene referred to ECTFE.

In one embodiment, the fluoropolymer dispersion can include a filling material capable of diverging visible light. There are various particles capable of diverging visible light, such as metal salts, metal hydrogen oxide, or metal oxide, or white pigment such as titanium dioxide. In one embodiment, the content of the particle capable of diverging visible light is about 20 wt % to 60 wt % of the total weight of the fluoropolymer dispersion.

In one embodiment, the fluoropolymer dispersion can include a filling material capable of adjusting modulus of the surface coating layer. In detail, the adjusting of modulus of the surface coating layer can include adjusting thermal expansion coefficient, thermal conductivity by suitable filling materials, wherein the suitable filling materials can be glass fibers or hollow glass microspheres.

In one embodiment, the fluoropolymer dispersion can include a luminescent compound. The luminescent compound can convert the light to be reflected by the surface coating layer into a desired color. For example, the luminescent compound can convert the blue light to be reflected into green or red light, or convert UV light into blue, green, or red light. The luminescent compound can be phosphorescent or fluorescent.

Figure 3:
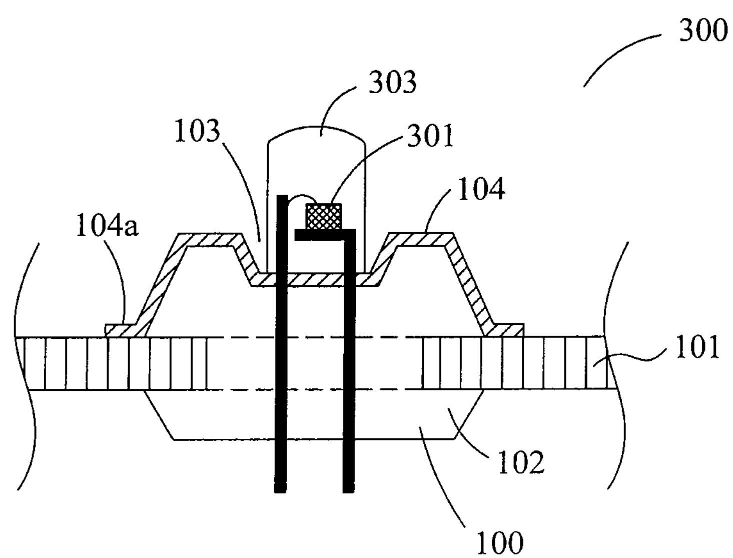
FIG. 3 is a cross-sectional view of the LED structure including the housing of FIG. 1A in accordance with one embodiment of the present invention.

FIG. 3 illustrates one embodiment of the present invention showing an LED structure 300 including the housing 100 and a light-emitting diode chip 301. As shown in FIG. 3, the housing 100 is identical to the housing of FIG. 1A. The housing 100 includes the recess 103 for supporting the light-emitting diode chip 301 which is covered by the package 303. The light-emitting diode chip 301 can be any suitable LED chip, such as LED chips emitting light of wavelength from UV light to infrared. The LED structure 300 is illustrated with the housing of FIG. 1A as an example, but is not limited thereto. The LED structure can be embodied with the LED chip disposed on any housing described in the above embodiments.

The foregoing preferred embodiments are provided to illustrate and disclose the technical features of the present invention, and are not intended to be restrictive of the scope of the present invention. Hence, all equivalent variations or modifications made to the foregoing embodiments without departing from the spirit embodied in the disclosure of the present invention should fall within the scope of the present invention as set forth in the appended claims.

The invention claimed is:

1. A housing for supporting a light-emitting diode chip, comprising:

a housing body made of non-fluoro-containing polymer; and a surface coating layer covering at least a portion of the housing body, wherein the surface coating layer is made of fluoropolymer dispersion and provided for reflecting light emitted from a light-emitting diode chip and from the undersurface side of the light-emitting diode chip disposed on the housing so as to protect the housing body from the light, and the housing further comprises a recess for positioning the light-emitting diode chip, the surface coating layer covers a surface of the recess.

2. The housing of claim 1, wherein the housing body is made of PPA engineering plastics.

3. The housing of claim 1, wherein the fluoropolymer dispersion comprises fluoropolymer, the fluoropolymer comprises homopolymer of vinyl fluoride, copolymer of perfluoroalkoxy fluorocarbon resin, or homopolymer of vinylidene fluoride.

4. The housing of claim 1, wherein the fluoropolymer dispersion comprises a filling material capable of diverging visible light.

5. The housing of claim 1, wherein the fluoropolymer dispersion comprises a filling material capable of adjusting modulus of the surface coating layer.

6. The housing of claim 1, wherein the fluoropolymer dispersion comprises a luminescent compound.

7. A structure of light-emitting diode, comprising:

the housing of claim 1; and the light-emitting diode chip disposed on the housing.

8. The structure of light-emitting diode of claim 7, wherein the housing body is made of PPA engineering plastic.

9. The structure of light-emitting diode of claim 7, wherein the fluoropolymer dispersion comprises fluoropolymer, the fluoropolymer comprises homopolymer of vinyl fluoride, copolymer of perfluoroalkoxy fluorocarbon resin, or homopolymer of vinylidene fluoride.

10. The structure of light-emitting diode of claim 7, wherein the fluoropolymer dispersion comprises a filling material capable of diverging visible light.

11. The structure of light-emitting diode of claim 7, wherein the fluoropolymer dispersion comprises a filling material capable of adjusting modulus of the surface coating layer.

12. The structure of light-emitting diode of claim 7, wherein the fluoropolymer dispersion comprises a luminescent compound.

13. A housing for supporting a light-emitting diode chip, comprising:

a housing body made of non-fluoro-containing polymer, the housing body further comprising a recess; and a surface coating layer conformally coated on a surface of the recess, wherein the surface coating layer is made of fluoropolymer dispersion and is provided for reflecting light emitted from a light-emitting diode chip disposed on the recess so as to protect the housing body from the light.

14. The housing of claim 13, wherein the fluoropolymer dispersion comprises fluoropolymer, the fluoropolymer comprises homopolymer of vinyl fluoride, or copolymer of perfluoroalkoxy fluorocarbon resin.

15. A housing for supporting a light-emitting diode chip, comprising:

a housing body made of non-fluoro-containing polymer; and a surface coating layer conformally coated on a surface the housing body, wherein the surface coating layer is made of fluoropolymer dispersion and is provided for reflecting light emitted from a light-emitting diode chip disposed on the housing body so as to protect the housing body from the light, and a portion of the surface coating layer is located under the light-emitting diode and between the housing body and the light-emitting diode chip.

16. The housing of claim 15, wherein the housing body further comprises a recess, the light-emitting diode chip is disposed on the recess, and the surface coating layer only covers the surface of the recess.

* * * * *